United States Patent [19]
Hesley

[11] Patent Number: 5,995,420
[45] Date of Patent: Nov. 30, 1999

[54] INTEGRATED XNOR FLIP-FLOP FOR CACHE TAG COMPARISON

[75] Inventor: Steven C. Hesley, Austin, Tex.

[73] Assignee: Advanced Micro Devices, Inc., Sunnyvale, Calif.

[21] Appl. No.: 08/915,001

[22] Filed: Aug. 20, 1997

[51] Int. Cl.[6] .......................... G06F 9/305; G06F 12/08
[52] U.S. Cl. .................. 365/189.07; 365/189.09; 340/146.2; 326/54; 326/52; 327/12; 327/43; 327/64; 327/97; 711/118; 711/144; 711/145; 711/205; 711/207; 711/208
[58] Field of Search ........................ 326/54, 52, 93, 326/104; 365/189.07, 189.09, 49, 154, 203; 327/3, 12, 43, 64, 97; 340/146.2; 395/564; 711/118, 144, 145, 205, 207, 208

[56] References Cited

U.S. PATENT DOCUMENTS

| | | | |
|---|---|---|---|
| 5,301,141 | 4/1994 | Traylor | 365/49 |
| 5,381,127 | 1/1995 | Khieu | 340/146.2 |
| 5,386,527 | 1/1995 | Bosshart | 711/3 |
| 5,497,347 | 3/1996 | Feng | 365/189.07 |
| 5,528,541 | 6/1996 | Ghia et al. | 365/203 |
| 5,623,437 | 4/1997 | Nogle et al. | 365/49 |
| 5,630,160 | 5/1997 | Simpson et al. | 364/763.01 |

FOREIGN PATENT DOCUMENTS

| | | |
|---|---|---|
| 6-44134 | 2/1994 | Japan . |
| 6-75748 | 3/1994 | Japan . |

*Primary Examiner*—B. James Peikari
*Attorney, Agent, or Firm*—Conley, Rose & Tayon, PC; B. Noel Kivlin

[57] ABSTRACT

An integrated XNOR flip-flop is provided which is faster than conventional XNOR flip-flop combinations. The integrated XNOR flip-flop is faster and uses less area than conventional XNOR flip-flop combinations. The integrated circuit has few gates along the critical path and takes advantage of the set up times inherent in the flip-flop. Accordingly, the integrated XNOR flip-flop is able to perform the same function in an expedient manner. In one illustrative embodiment, a plurality of the integrated XNOR flip-flops are used to compare a tag of a cache memory with an address to determine whether the desired address is available in the cache.

9 Claims, 7 Drawing Sheets

5,995,420

INTEGRATED XNOR FLIP-FLOP FOR CACHE TAG COMPARISON

BACKGROUND OF THE INVENTION

1. Field of the Invention

The present invention relates generally to static comparator circuits and more particularly to an integrated exclusive-nor gate and flip-flop.

2. Description of the Relevant Art

Exclusive-or (XOR) gates are often used in electronic circuits to compare the logic levels of input signals. The output of an exclusive-or gate is asserted if one, but not both, of the inputs to the exclusive-or gate are asserted. If both inputs to the exclusive-or gate are asserted or both inputs are deasserted, the output of the exclusive-or gate is deasserted. An exclusive-nor (XNOR) gate is similar to an exclusive-or gate with the output inverted. Accordingly, the output of an exclusive-nor gate is asserted if both inputs are asserted or both inputs are deasserted. An exclusive-or or an exclusive-nor gate may be used to determine whether the logic levels of two inputs are the same.

It is often desirable to perform a static comparison of two inputs. Static logic circuits are often more desirable than dynamic logic circuits. Static logic circuits are more robust with respect to noise than dynamic circuits. Additionally, in certain cases, static circuits consume less power than dynamic circuits (power consumption is pattern and implementation dependent). Static circuits are also faster in some cases, especially if the desired evaluation phase coincides with the precharge phase of a dynamic circuit.

Turning now to FIG. 1, one embodiment of a static comparator is shown. FIG. 1 illustrates a one-bit static comparator using an exclusive-nor (XNOR) gate. FIG. 1 includes flip-flop 102, flip-flop 104, and exclusive-nor gate 106. Exclusive-nor 106 includes inverters 108, 110 and 116, and transmission gates 112 and 114.

A first input of flip-flop 102 is coupled to input A. A first input of flip-flop 104 is coupled to input B. The clock inputs of flip-flops 102 and 104 are coupled to a clock signal (CLK). The outputs of flip-flops 102 and 104 are coupled to inputs of exclusive-nor gate 106. The output of exclusive-nor gate 106 is coupled to an output Z.

On a predefined edge of the clock signal flip-flops 102 and 104 latch the current state of input signals A and B respectively. A short time after the predetermined edge of the clock signal, the logic levels of inputs A and B are available at the outputs of flip-flops 102 and 104 and at the inputs of exclusive-nor gate 106. After a short delay, output Z of exclusive-nor gate 106 will be asserted if the inputs A and B are the same logic state. Alternatively, output Z will be deasserted if inputs A and B are different logic states. Because inputs A and B are captured by flip-flops 102 and 104, the circuits that drive A and B may transition after the predetermined edge of the clock without affecting the output Z.

As noted above, output Z of exclusive-nor gate 106 is asserted when either both inputs are asserted or both inputs are deasserted. Input B controls transmission gates 112 and 114. If input B is asserted, then transmission gate 114 logically couples input A to output Z. The output of inverter 108 is the inversion of input A and the output of inverter 116, which is output Z, is the same state as input signal A. Accordingly, when input B is asserted, output Z is asserted if input signal A is asserted and output Z is deasserted if input signal A is deasserted.

If input signal B is deasserted, then output signal Z is the inverse of input signal A. If input signal A is asserted, output signal Z is deasserted. Transmission gate 112 logically couples input A to the input of inverter 116 when input B is deasserted.

Although FIG. 1 illustrates a single bit comparator, a plurality of single bit comparators may be combined to compare multiple bits. In this embodiment, each pair of bits of the input signals are compared using a comparator similar to the one illustrated in FIG. 1. The outputs of each single-bit comparator may be input to an AND gate. If each pair of bits are the same logic level, then all the outputs of the comparators will be asserted. Accordingly, the output of the AND gate coupled to the comparators will also be asserted indicating that the multiple bit inputs are the same.

Turning now to FIG. 2, one embodiment of a flip-flop is shown. Flip-flop 102 includes inverters 202, 204, 210, 212, 216, 218 and 220, NAND gate 206, NOR gate 208, and transmission gate 214. In one embodiment, transmission gate 214 logically couples the output of inverter 210 to the input of inverter 220 when the output of NOR gate 208 is asserted. NOR gate 208 is asserted when both the clock input signal and the output of NAND gate 206 are deasserted. If the enable (ENB) input signal is deasserted, NAND gate 206 is asserted which prevents NOR gate 208 from enabling transmission gate 214. Thus, if the enable input signal is deasserted, transmission gate 214 is disabled. Alternatively, if the enable input signal (ENB) is asserted, the output of NAND gate 206 is deasserted when the output of inverter 204 is asserted. The output of inverter 204 is a delayed version of the clock input signal. Accordingly, when the enable input is asserted, NOR gate 208 will enable transmission gate 214 while the clock signal is deasserted and a delayed version of the clock signal is asserted. This set of conditions exists for a brief period of time on a transition of the clock signal from the asserted to the deasserted state. This brief period of time is approximately equal to the propagation delay of inverters 202 and 204 and NAND gate 206. During this brief period of time, transmission gate 214 is enabled and couples the inversion of the input to the inputs of inverters 218 and 220.

Inverters 216 and 218 comprise a keeper circuit. The keeper circuit is designed to maintain the logic level of the output of transmission gate 214 after transmission gate 214 has been disabled. When transmission gate 214 is enabled, it drives the input of inverter 218. The current drive of transmission gate 214 is sufficient to overcome the current output of inverter 216. Accordingly, if the output of transmission gate 214 is a different state than the output of inverter 216, the output of inverter 218 will be the inversion of the output of transmission gate 214, not inverter 216. The output of inverter 218 drives the input inverter 216 such that the output of inverter 216 is the same state as the output of inverter 214. After transmission gate 214 is disabled, inverters 216 and 218 maintain the logic level output by transmission gate 214 prior to being disabled. Inverter 220 inverts the state maintained by inverters 216 and 218 and buffers the output Q.

Flip-flop 104 may implement a similar or identical circuit to flip-flop 104.

Unfortunately, conventional comparison circuits such as those shown in FIGS. 1 and 2 are too slow for some applications. What is desired is a faster static comparator circuit.

SUMMARY OF THE INVENTION

The problems outline above are largely solved by an integrated exclusive-nor flip-flop circuit. In one embodiment, the integrated exclusive-nor flip-flop circuit combines the three elements of FIG. 1 into one circuit. The circuit takes advantage of the set up times inherent in the flip-flop and the circuit has fewer gates are along the critical path. Accordingly, the integrated exclusive-nor flip-flop is faster than conventional comparator circuits and requires fewer gates to implement.

Broadly speaking, the present invention contemplates an integrated exclusive-nor flip-flop including a first edge detector, a second edge detector, a first switch, a second switch and a keeper circuit. The first edge detector is coupled to a clock signal and a first input signal. The first edge detector asserts a first output signal if the first input signal is asserted on a predetermined edge of the clock signal. The second edge detector is coupled to the clock signal and the first input signal. The second edge detector asserts a second output signal if the first input signal is deasserted on the predetermined edge of the clock signal. The first switch is coupled to the first output signal of the first edge detector and a second input signal. The first switch outputs the second input signal if the first output signal is asserted. The second switch is coupled to the second output signal of the second edge detector and an inversion of the second input signal. The second switch outputs the inversion of the second input signal if the second output signal is asserted. The keeper circuit is coupled to the output of the first pass gate and the output of the second pass gate, wherein the keeper circuit maintains a logic level of the outputs of the first and second pass gates. The logic level is indicative of the exclusive-nor of the first input signal and the second input signal captured on a predetermined edge of the clock signal.

The present invention further contemplates a cache system including a cache storage device and a comparator. The cache storage device is coupled to an index signal and configured to store data blocks and tags that identify an address of the data blocks. The cache storage device outputs one of the tags in response to the index signal. The comparator is coupled to the tag output by the cache memory and to an address signal.

The comparator compares the address signal to the tag of the cache storage device and outputs a hit signal indicative of whether the tag matches the address signal. The comparator includes a plurality of integrated exclusive-nor flip-flops and an AND gate. Each integrated exclusive-nor flip-flop compares one bit of the address signal to one bit of the tag and outputs a bit signal indicative of whether the one bit of the tag matches the one bit of the address signal. The AND gate is coupled to receive the bit signals of the plurality of integrated exclusive-nor and flip-flops and to output the hit signal. One of the plurality of integrated exclusive-nor and flip-flops includes a first edge detector, a second edge detector, a first switch, a second switch and a keeper circuit. The first edge detector is coupled to a clock signal and a first input signal. The first edge detector asserts a first output signal if the first input signal is asserted on a predetermined edge of the clock signal. The second edge detector is coupled to the clock signal and a the first input signal. The second edge detector asserts a second output signal if the first input signal is deasserted on the predetermined edge of the clock signal. The first switch is coupled to the first output signal of the first edge detector and a second input signal. The first switch outputs the second input signal if the first output signal is asserted. The second switch is coupled to the second output signal of the second edge detector and an inversion of the second input signal. The second switch outputs the inversion of the second input signal if the second output signal is asserted. The keeper circuit is coupled to the output of the first pass gate and the output of the second pass gate, wherein the keeper circuit maintains a logic level of the outputs of the first and second pass gates. The logic level is indicative of the exclusive-nor of the first input signal and the second input signal.

BRIEF DESCRIPTION OF THE DRAWINGS

A better understanding of the present invention can be obtained when the following detailed description of the preferred embodiment is considered in conjunction with the following drawings, in which.

Figure 1:
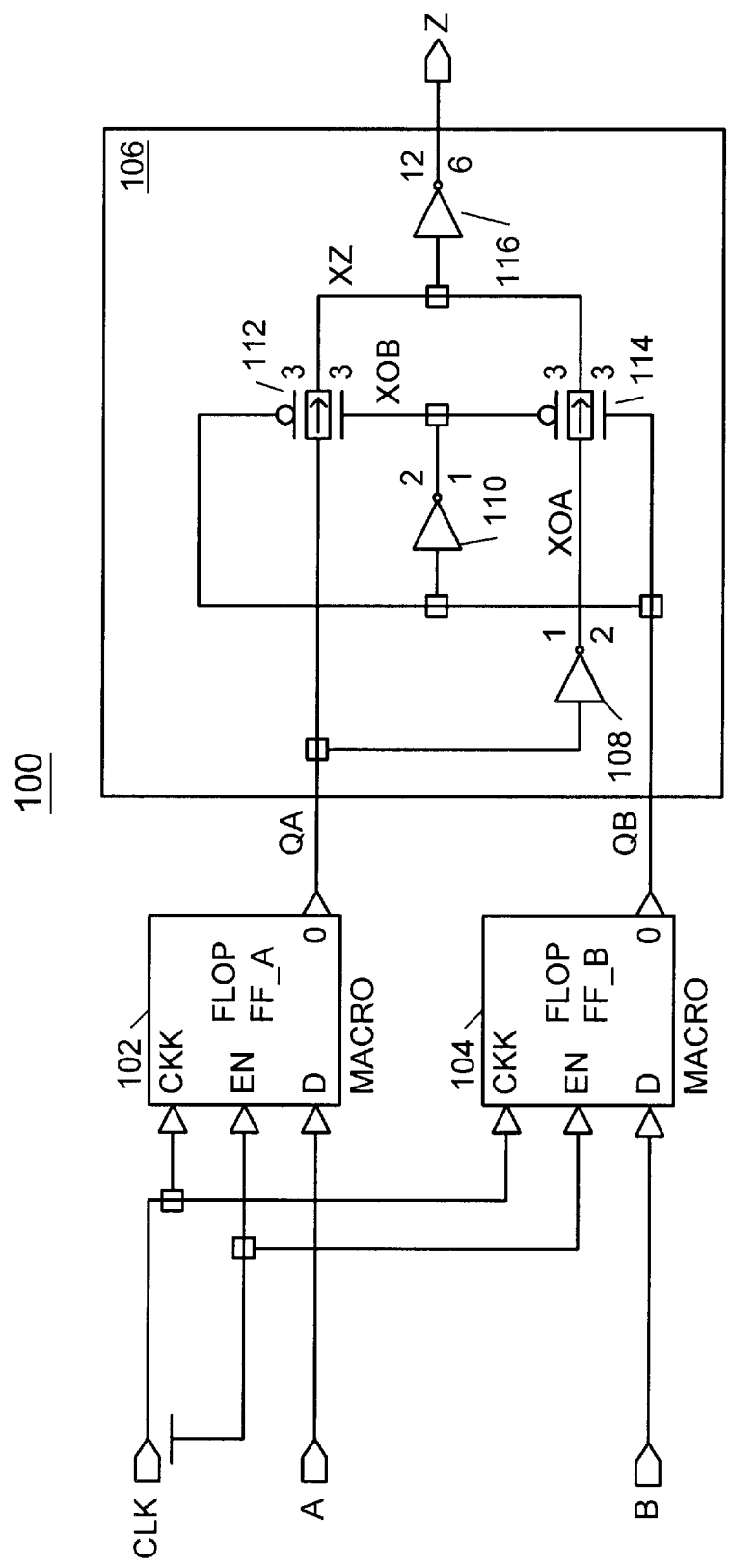
FIG. 1 is a block diagram of a conventional comparator circuit.

While the invention is susceptible to various modifications and alternative forms, specific embodiments thereof are shown by way of example in the drawings and will herein be described in detail. It should be understood, however, that the drawing and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE DRAWINGS

Figure 3:
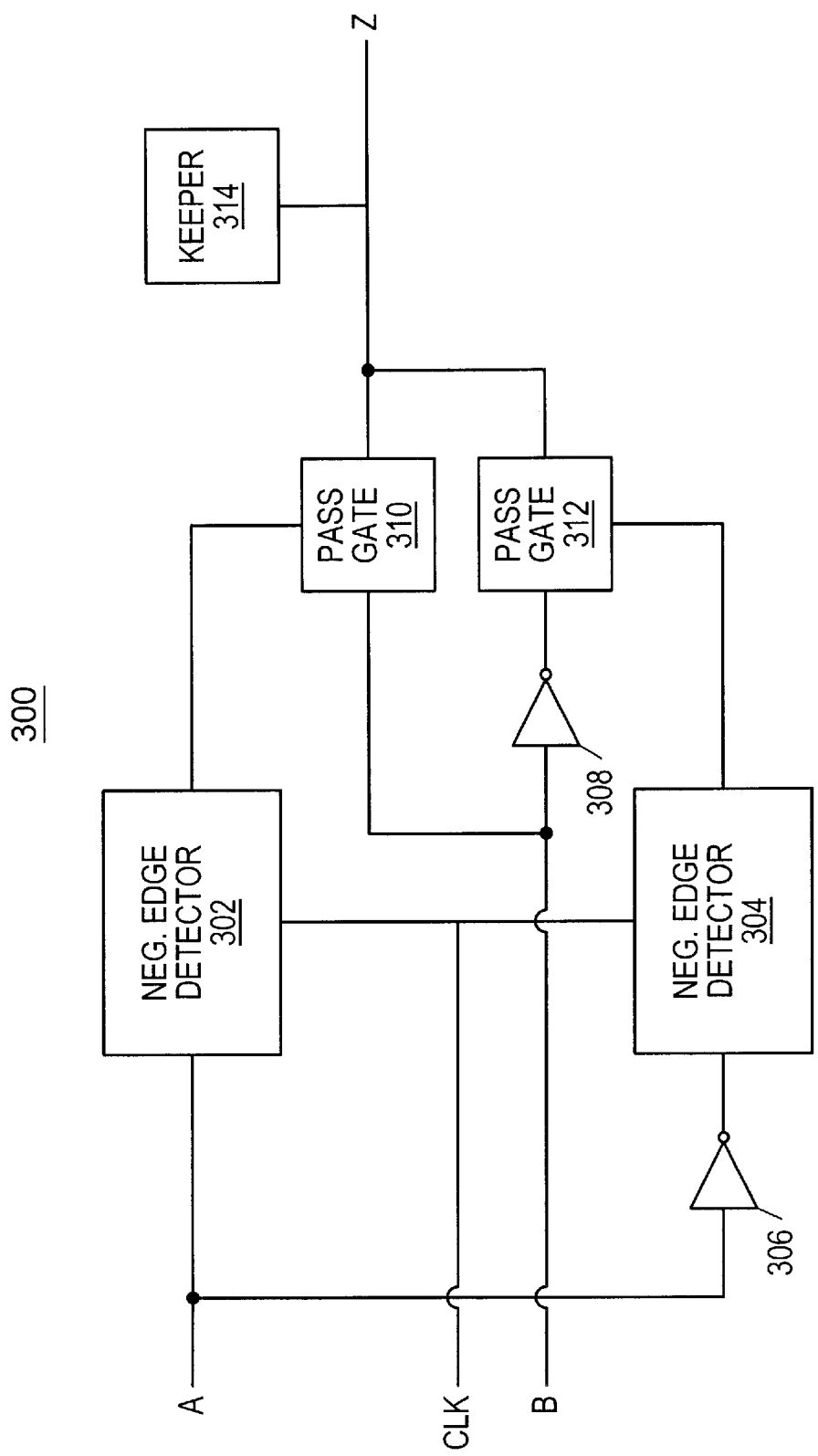
FIG. 3 is a block diagram of an integrated XNOR flip-flop according to one embodiment of the present invention.

Turning now to FIG. 3, a block diagram of an integrated XNOR flip-flop 300 is shown. Integrated XNOR flip-flop 300 includes negative edge detectors 302 and 304, inverters 306 and 308, pass gates 310 and 312, and keeper circuit 314. Negative edge detector 302 receives input signal A and a clock signal. Negative edge detector 304 receives an inversion of input signal A from inverter 306 and the clock signal. An output of negative edge detector 302 is coupled to a control input of pass gate 310 and an output of negative edge detector 304 is coupled to a control input of pass gate 312. Pass gate 310 is coupled to input signal B and pass gate 312 is coupled to an inversion of input signal B from inverter 308. Pass gates 310 and 312 are examples of switches and shown for illustrative purposes only. The present invention contemplates any conventional switches such as FET devices, bipolar devices, electronic relays, etc. The outputs of pass gates 310 and 312 are coupled to keeper circuit 314 and output Z.

Negative edge detector 302 detects the state of input A on the falling edge of the clock input. A negative edge detector is shown for illustrative purposes only. A positive edge detector or other device to detect the state of an input at a predetermined time may be used. In the illustrated embodiment, if input A is asserted on the falling edge of the clock signal, the output of negative edge detector 302 is asserted. The output of negative edge detector 302 is coupled to a control input of pass gate 310. When the output of negative edge detector 302 is asserted, an output of pass gate 310 is logically coupled to an input of pass gate 310. Accordingly, when the output of negative edge detector 302 is asserted, pass gate 310 outputs the logic level of input signal B. When the output of negative edge detector 302 is deasserted, pass gate 310 is in a high impedance state.

In a similar manner, negative edge detector 304 outputs a signal indicative of a logic level of the inversion of input signal A on the falling edge of the clock input signal. Input signal A is coupled to an input of inverter 306. The output of inverter 306 is input to negative edge detector 304. Accordingly, the output of negative edge detector 304 is asserted if A is deasserted on the falling edge of the clock input signal. A control input of pass gate 312 is coupled to the output of negative edge detector 304. If the output of edge detector 304 is asserted, pass gate 312 logically couples the output of pass gate 312 to the input of pass gate 312. The input of pass gate 312 is coupled an output of inverter 308 which is coupled to input signal B. Accordingly, when the output of a negative edge detector 304 is asserted, pass gate 312 outputs the inverse of the logic level of input signal B. The output of pass gate 312 is coupled to the output of pass gate 310, keeper circuit 314 and the output Z.

To prevent pass gate 310 and pass gate 312 from attempting to drive output Z to different logic levels, pass gate 310 and pass gate 312 should not both be enabled concurrently. Because negative edge detector 302 detects the logic level of input signal A and negative edge detector 304 detects the logic level of the inversion of input signal A on the same edge of the input clock signal, one and only one of the outputs of negative edge detector 302 and 304 should be asserted at one time. Accordingly, both pass gates 310 and 312 will not be enabled at the same time.

In the illustrated embodiment, if input signal A is asserted on the falling edge of the clock signal, pass gate 310 is enabled. Pass gate 310 will output the logic level of input signal B. If input signal B is asserted, output Z is also asserted. If input signal B is deasserted, output Z is also deasserted. Alternatively, if input signal A is deasserted on the falling edge of the clock input signal, pass gate 312 is enabled. Pass gate 312 outputs the inverse of the logic level of input signal B. If input signal B is deasserted, output Z is deasserted. If input signal B is asserted, output signal Z is deasserted. If A and B are both asserted or both deasserted, output Z is asserted. If one input is asserted and the other deasserted, output Z is deasserted.

In one embodiment, negative edge detectors 302 and 304 enable pass gates 310 and 312 for a relatively short period of time. When pass gates 310 and 312 are not enabled, the pass gates are in a high impedance state. In other words, pass gates 310 and 312 do not drive a logic level to output Z. Keeper circuit 314 maintains the last logic level of output Z when pass gates 310 and 312 are in a high impedance state. Accordingly, a minimum amount of circuitry is required to maintain the state of output Z.

Figure 4:
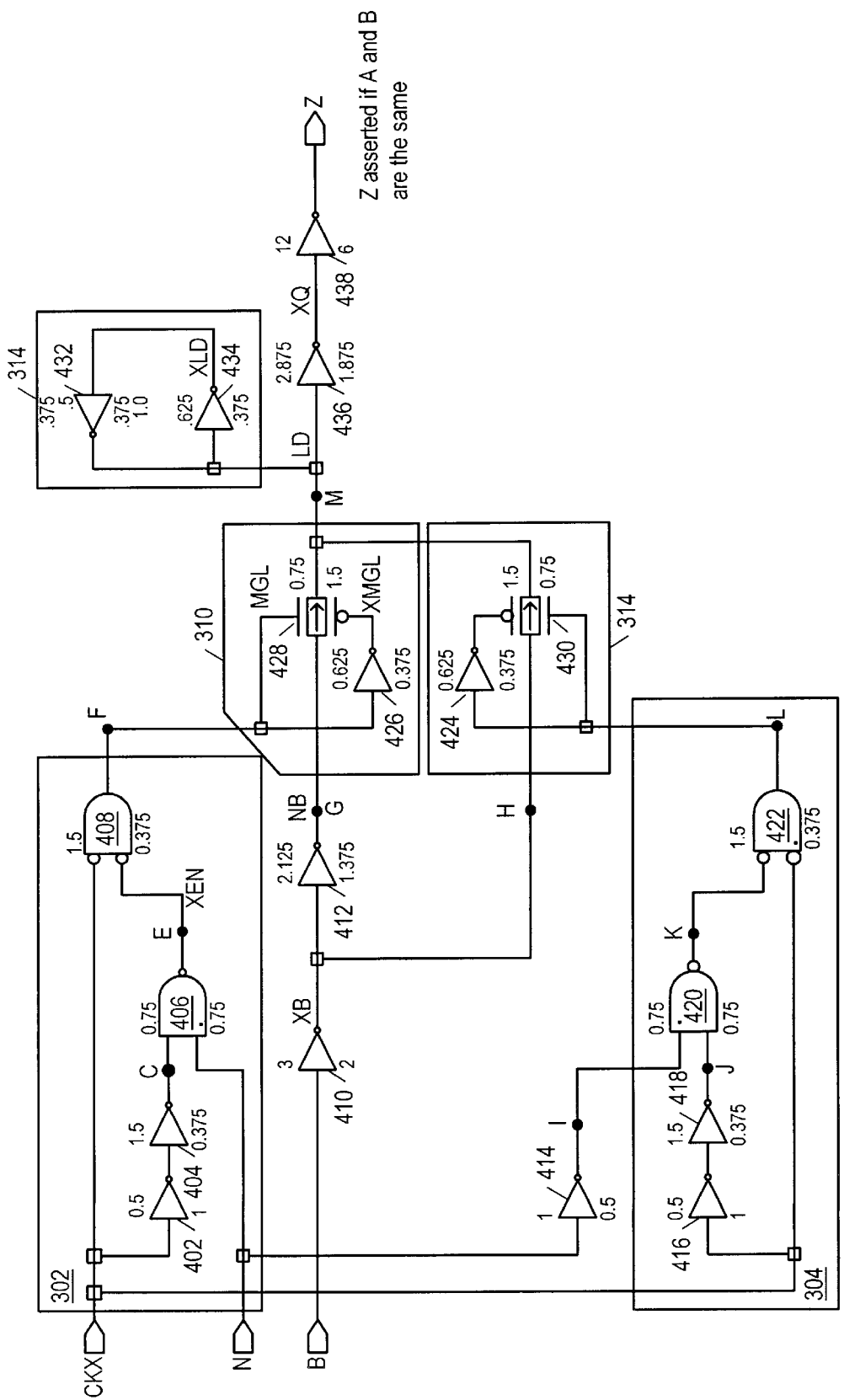
FIG. 4 is a circuit level diagram of an integrated XNOR flip-flop according to one embodiment of the present invention.

Turning now to FIG. 4, a circuit level diagram of integrated XNOR flip-flop 300 is shown. Elements and devices that are similar or identical to those shown in FIG. 3 are given the same reference numerals for convenience. Negative edge detector 302 includes inverters 402 and 404, NAND gate 406 and NOR gate 408. Negative edge detector 304 includes inverters 416 and 418, NAND gate 420 and NOR gate 422. Pass gate 310 includes transmission gate 428 and inverter 426 Pass gate 312 includes transmission gate 430 and inverter 424. Keeper circuit 314 includes inverters 432 and 434. XNOR flip-flop 300 further includes inverters 410, 412, 414, 436, and 438.

As discussed above, negative edge detector 302 detects the state of input A on the falling edge of the clock input signal. The output of negative edge detector 302 is asserted when both inputs to NOR gate 408 are deasserted. A first input to NOR gate 40 is coupled to the clock input. A second input to NOR gate 408 is coupled to an output of NAND gate 406. When the clock signal and input signal A are asserted, the output of NAND gate 406 is deasserted. When the clock signal transitions to a deasserted state, the output of NAND gate 406 transitions to an asserted state. There is a propagation delay, however, between the transition of the clock signal and the transition of the outputs of the NAND gate. The propagation delay is approximately equal to the propagation delay of inverters 402 and 404 and NAND gate 406. When the clock signal transitions to a deasserted state and input signal A is asserted, both inputs of NOR gate 408 are deasserted for a period of time approximately equal to the propagation delay of those gates. Accordingly, if input signal A is asserted on the following edge of the clock signal, the output of negative edge detector 302 is asserted for a period of time approximately equal to the propagation delay of inverters 402 and 404 and NAND gate 406. Conversely, if input A is deasserted, the output of NAND gate 406 will remain asserted regardless of the state of the clock signal, and the output of negative edge detector 302 will not be asserted. In the above described manner, negative edge detector 302 is asserted for a relatively short period of time when input signal A is asserted during the transition of the clock input signal from the asserted state to the deasserted state.

In a similar manner, negative edge detector 304 is asserted for a relatively short period of time if the output of inverter 414 is asserted during the transition of the clock signal from the asserted state to the deasserted state. The output of inverter 414 is the inverse of input signal A. Accordingly, either the output of negative edge detector 302 or the output of negative edge detector 304 is asserted, each falling edge of the clock signal. If input signal A is asserted, the output of negative edge detector 302 is asserted. If input signal A is deasserted, the output of negative edge detector 304 is asserted.

Negative edge detector 302 enables pass gate 310 and negative edge detector 304 enables pass gate 312. If pass gate 310 is enabled, output Z is logically coupled to input signal B. If pass gate 312 is enabled, output Z is logically coupled to the inverse of input signal B.

As noted above, pass gate 310 includes transmission gate 428 and inverter 426. Transmission gate 428 logically couples its input to its output when a first input is asserted and a second input is deasserted. In the illustrated embodiment, the first input of transmission gate 428 is coupled to the output of NOR gate 408. The second input of transmission gate 428 is coupled to the output of inverter 426. The input of inverter 426 is coupled to the output of NOR gate 408. Accordingly, when the output of NOR gate 408 is asserted, the input to the transmission gate is logically coupled to the output of the transmission gate. The input of the transmission gate is coupled to the output of inverter 412. The output of inverter 412 is the same logic level as input signal B.

Pass gate 312 includes transmission gate 430 and inverter 424. Transmission gate 430 logically couples the output of inverter 410 to output Z when the output of NOR gate 422 is asserted.

Keeper circuit 314 includes a pair of inverters. As noted above, keeper circuit 314 maintains the logic level output by pass gate 310 or 312 when the pass gates are in a high impedance state. For example, if pass gate 310 or pass gate 312 asserts the input of inverter 434, the output of inverter 434, which is coupled to the input of inverter 432, is deasserted and the output of inverter 432 is asserted. When the pass gates enter a high impedance mode, inverter 432 continues to assert the same logic level. Inverters 434 and 432 will maintain that logic level until pass gate 310 or pass gate 312 is again enabled. It is important to note that pass gates 310 and 312 should be capable of supplying more current than inverter 432. Accordingly, the pass gates are able to change the state of keeper circuit 314, inverter 436 and output Z.

Inverters 436 and 438 are buffer circuits that increase the current drive capability of output Z. Because two inverters in series are implemented, output Z will be the same logic level as the output driven by pass gate 310 or 312.

Figure 2:
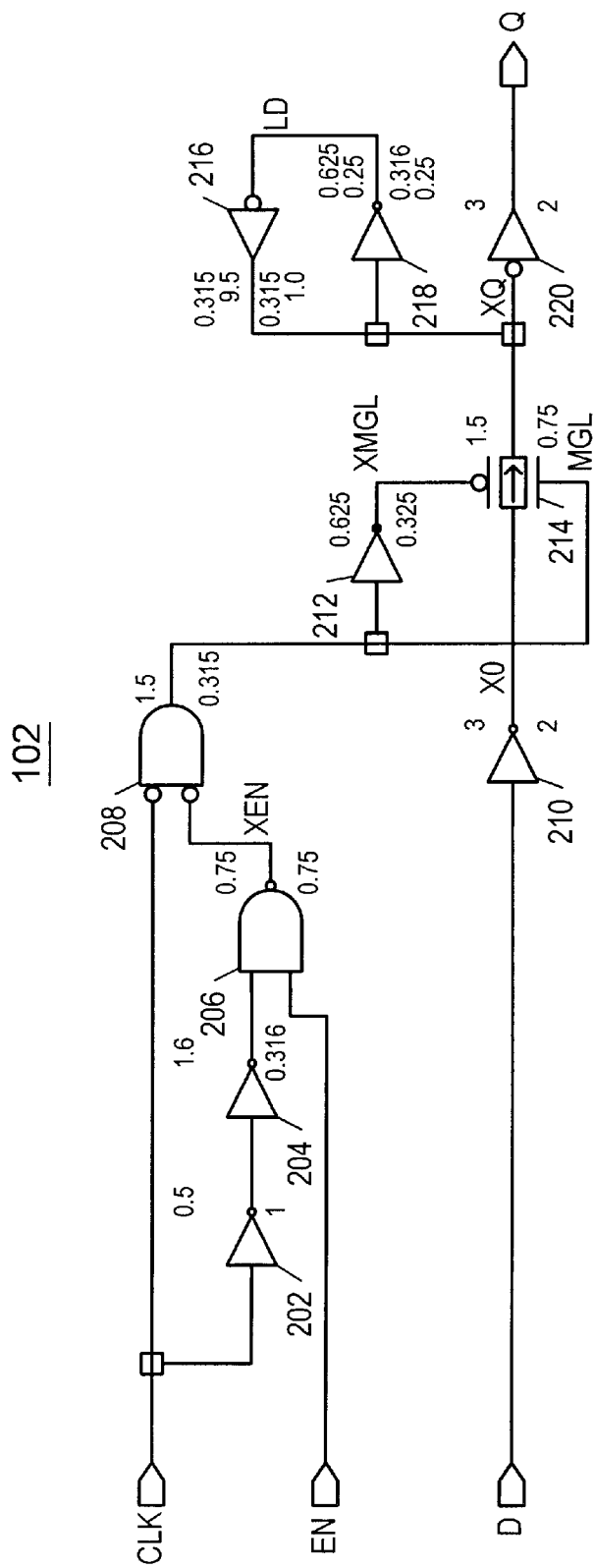
FIG. 2 is a circuit level diagram of a conventional flip-flop.

Integrated XNOR flip-flop 300 uses less area than the conventional circuits shown in FIGS. 1 and 2. Integrated XNOR flip-flop 300 uses 46 transistors [13 Inverters (2 transistors each), 2 NAND gates (4 transistors each), 2 NOR gates (4 transistors each) and 2 transmission gates (2 transistors each)], while the conventional circuits shown in FIGS. 1 and 2 use 58 transistors [17 inverters, 4 transmission gates, 2 NAND gates and 2 NOR gates]. Additionally, integrated XNOR flip-flop 300 is faster than conventional circuits. Integrated XNOR flip-flop 300 has fewer gates along the critical path. For example, in FIGS. 1 and 2, the critical path includes inverters 202 and 204, NAND gate 206, NOR gate 208, inverter 212, transmission gate 214, inverter 220, inverter 110, transmission gate 114 and inverter 116. In contrast, the critical path of XNOR flip-flop 300 includes inverters 402 and 404, NAND 406, NOR gate 408, inverter 426, transmission gate 428, and inverters 436 and 438.

Figure 5:
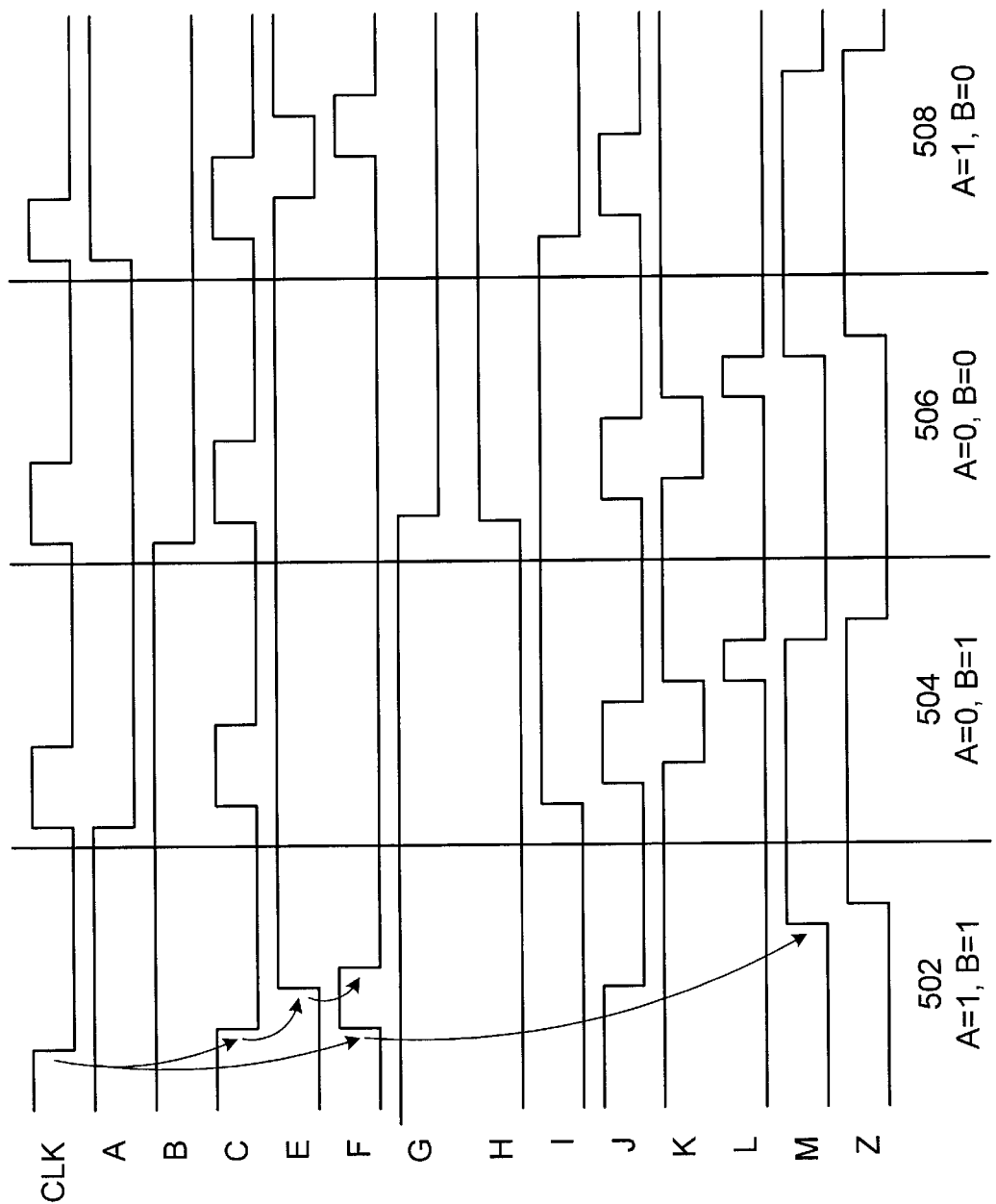
FIG. 5 is a timing diagram illustrating the operation of the integrated XNOR flip-flop shown in FIG. 4.

Turning now to FIG. 5, a timing diagram illustrating the operation of integrated XNOR flip-flop 300 is shown. FIG. 5 illustrates the logic levels of the clock signal (CLK), input signal A, input signal B, output signal Z, and other signals within integrated XNOR flip-flop 300. The signals illustrated in FIG. 5 are identified by letters in FIG. 4. For example, signal C represents the logic level of the output of inverter 404, signal E represents the logic level of the output of NAND gate 406, signal F represents the logic level of the output of NOR gate 408, etc. FIG. 5 is divided into four sections. Section 502 illustrates the logic level of the signals of integrated XNOR flip-flop 300 when input signals A and B are both asserted. Section 504 illustrates the logic level of the signals of integrated XNOR flip-flop 300 when input signal A is deasserted and input signal B is asserted. Section 506 illustrates the logic levels of the signals of integrated XNOR flip-flop 300 when both input signals A and B are deasserted. Section 508 illustrates the logic levels of signals of integrated XNOR flip-flop 300 when input signal A is asserted and input signal B is deasserted.

Referring now to section 502, signal F, which is the output of negative edge detector 302, is asserted for a short period of time roughly equal to the propagation delay of inverters 402 and 404 and NAND gate 406. Because input signal A is asserted, signal L, which is the output of negative edge detector 304, is deasserted. Signal F enables pass gate 310 which logically couples signal M to input signal B which is asserted. When signal F is deasserted, pass gate 310 is disabled and the logic level at signals M is maintained by keeper circuit 314.

In section 504, input signal A is deasserted and input signal B is asserted. In section 504, signal L is asserted rather than signal F because input signal A is deasserted. Signal L enables pass gate 312 which logically couples signal M to signal H which is the inversion of signal B. Because input signal B is asserted, signal H is deasserted and pass gate 312 deasserts signal M. After signal L is deasserted, pass gate 312 enters a high impedance state and keeper circuit 314 maintains the logic level of signals M.

In section 506, input signal A and input signal B are deasserted. In a manner similar to that of section 504, signal L is asserted for a short period of time and pass gate 312 logically couples signal M to signal H. Because input signal B is deasserted, signal H is asserted which asserts signal M.

In section 508, signal F is asserted rather than signal L because input signal A is asserted. Signal F causes pass gate 310 to logically couple signal M to signal G which is the same logic level as input signal B. Accordingly, signal M and Z is deasserted and keeper circuit 314 maintains that logic level after signal F is deasserted.

Figure 6:
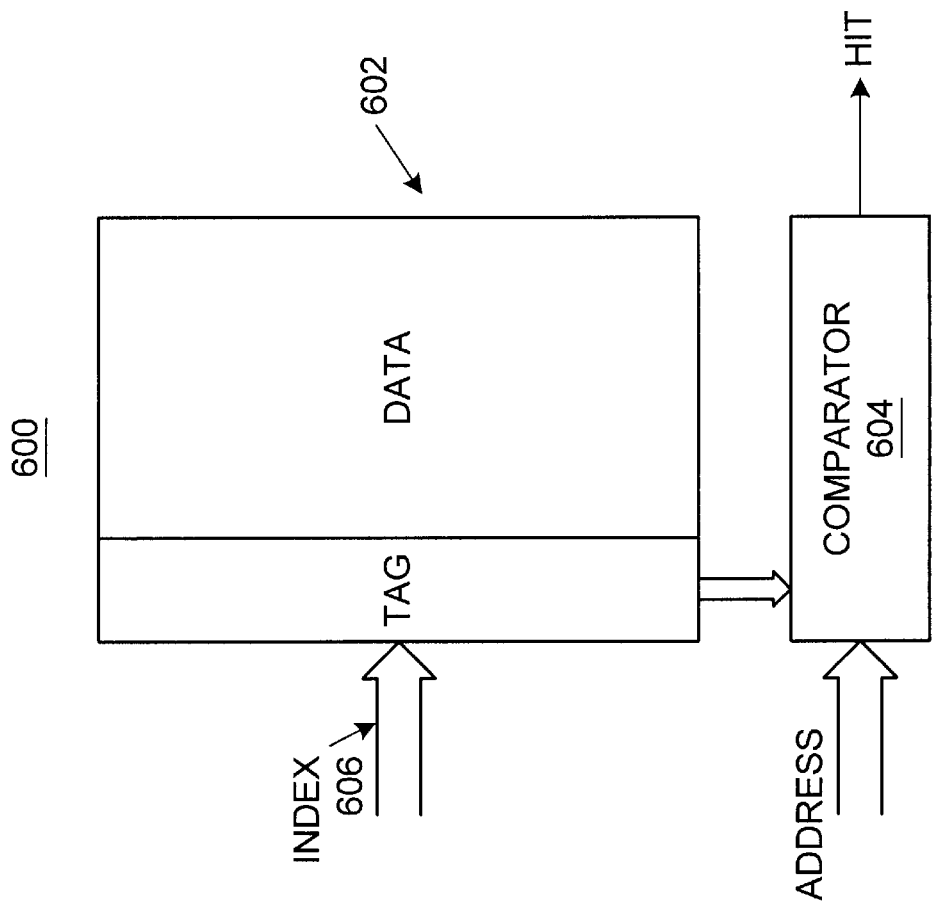
FIG. 6 is a block diagram of a cache memory implementing a comparator according to one embodiment of the present invention.

Turning now to FIG. 6, a cache memory 600 is shown. A cache memory is one example of an application for a comparator using an integrated XNOR flip-flop according to the present invention. Cache memory 600 includes a cache storage device 602 and a comparator 604. In the illustrated embodiment, cache storage device 602 includes a plurality of entries that each store a tag and a data value. In the illustrated embodiment, cache storage device 602 is directly mapped. In an alternative embodiment, cache storage device 602 may be set associative. An index signal 606 is conveyed to cache storage device 602. In response to index signal 606, cache storage device 602 outputs a tag signal to comparator 604. Comparator 604 compares the tag output by cache storage device 602 to an address signal to determine whether the indexed entry corresponds to the desired address. The output hit signal of comparator 604 is asserted if the tag is equal to the address signal. In one embodiment, the address signal is a linear address of a memory location desired to be accessed. Comparator 604 does a bit-by-bit comparison of the linear address with the tag to determine whether they match.

Figure 7:
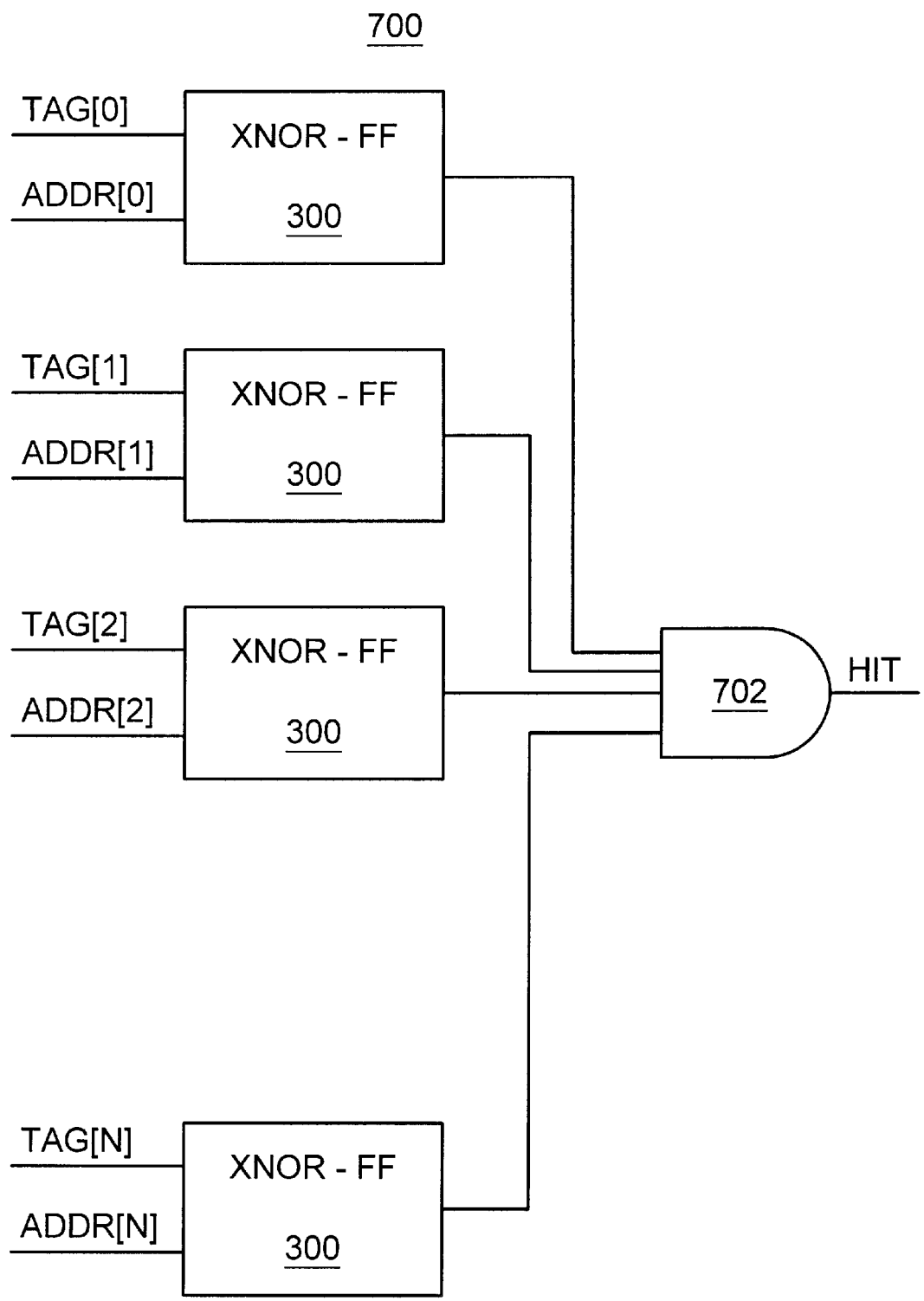
FIG. 7 is a block diagram of a comparator used in FIG. 6 according to one embodiment of the present invention.

Turning now to FIG. 7, block diagram of comparator 604 is shown according to one embodiment of the present invention. Comparator 604 includes a plurality of integrated XNOR flip-flops 300 and an AND gate 702. Each XNOR flip-flop 300 compares one bit of a tag input to one bit of an address input as discussed above. If both inputs are the same logic level, the output of the XNOR flip-flop 300 is asserted. Each pair of bits is compared by an XNOR flip-flop 300. Accordingly, comparator 604 may include a number of integrated XNOR flip-flops 300 equal to a number of bits to be compared. For example, if the tag value and the address in FIG. 5 are 16 bits, comparator 604 may include 16 integrated XNOR flip-flops 300.

The outputs of XNOR flip-flips 300 are input to AND gate 702. If the output of each XNOR flip-flop 300 is asserted, the output of AND gate 702 is also asserted. If the output of any XNOR flip-flops 300 is deasserted, the output of AND gate 702 will be deasserted.

The application illustrated in FIGS. 6 and 7 is for illustrative purposes only. A comparator according to the present invention may be used in a variety of applications. For example, cache storage device 602 may store physical address translations of linear tags. In an alternative embodiment, cache storage device 602 may be a four-way set associative cache. When an index is provided to cache storage device 602, four tags are output and comparator 604 compares the four tags to an address signal to identify which, if any, is the desired data. In another embodiment, a device may store a plurality of physical tags. When a requested physical tag is available, a comparator, using integrated XNOR flip-flops 300, may compare the requested physical tag to the stored physical tags to identify the desired physical tag.

The above specification refers to an asserted signal as a signal that is logically true or high. In an alternative embodiment, an asserted signal is logically false or low. The present invention contemplates embodiments that incorporate negative logic.

While the invention is susceptible to various modifications and alternative forms, specific embodiments thereof are shown by way of example in the drawings and will herein be described in detail. It should be understood, however, that the drawing and detailed description thereto are not intended to limit the invention to the particular form disclosed, but on the contrary, the intention is to cover all modifications, equivalents and alternatives falling within the spirit and scope of the present invention as defined by the appended claims.

What is claimed is:

1. A cache system including:
    a cache storage device coupled to an index signal and configured to store data blocks and tags that identify an address of said data blocks, wherein said cache storage device outputs one of said tags in response to said index signal;
    a comparator coupled to said tag output by said cache memory and to an address signal wherein:
        said comparator compares said address signal to said tag of said cache storage device and outputs a hit signal indicative of whether said tag matches said address signal; and
        said comparator includes:
            a plurality of integrated exclusive-nor and flip-flops, wherein each integrated exclusive-nor and flip-flop compares one bit of said address signal to one bit of said tag and outputs a bit signal indicative of whether said one bit of said tag matches said one bit of said address signal, and
            an AND gate coupled to receive said bit signals of said plurality of integrated exclusive-nor and flip-flops and to output said hit signal;
    wherein one of said plurality of integrated exclusive-nor flip-flops includes:
        a first edge detector coupled to a clock signal and a first input signal, wherein said first edge detector asserts a first output signal if said first input signal is asserted on a predetermined edge of said clock signal;
        a second edge detector coupled to said clock signal and said first input signal, wherein said second edge detector asserts a second output signal if said first input signal is deasserted on said predetermined edge of said clock signal;
        a first switch coupled to said first output signal of said first edge detector and a second input signal, wherein said first switch outputs said second input signal if said first output signal is asserted;
        a second switch coupled to said second output signal of said second edge detector and an inversion of said second input signal, wherein said second switch outputs said inversion of said second input signal if said second output signal is asserted; and
        a keeper circuit coupled to said output of said first switch and said output of said second switch, wherein said keeper circuit maintains a logic level of said outputs of said first and second pass gates;
        wherein said logic level is indicative of an exclusive-nor of said first input signal and said second input signal.

2. The cache system of claim 1 wherein said keeper circuit comprises a pair of feedback inverters.

3. The cache system of claim 1 wherein an input of a first of said pair of inverters is coupled to an output of said first switch and an output of said second switch, an output of said first of said pair of inverters is coupled to an input of a second of said pair of inverters, and an output of said second of said pair of inverters is coupled to said input of said first of said pair of inverters.

4. The cache system of claim 1 wherein said predetermined edge is a falling edge of said clock signal.

5. The cache system of claim 4 wherein said first edge detector comprises:
    an NAND gate with a first input coupled to said clock signal and a second input coupled to said first input signal; and
    an NOR gate with a first input coupled to an output of said NAND gate, a second input coupled to said clock signal, and an output coupled to said first output signal.

6. The cache system of claim 5 further comprising a pair of inverters coupled between said clock signal and said first input of said NAND gate.

7. The cache system of claim 1 wherein said first switch comprises:
    a first inverter with an input coupled to said first output signal; and
    a first transmission gate with an input coupled to said second input signal, a first control signal coupled to said first output signal, and a second control signal coupled to an output of said first inverter.

8. The cache system of claim 7 wherein said output of said first switch is coupled to said output of said second switch.

9. The cache system of claim 8 wherein only one of said first output signal and said second output signal are asserted at a given time.

* * * * *